US012704601B2

(12) United States Patent
Song

(10) Patent No.: US 12,704,601 B2
(45) Date of Patent: Aug. 11, 2026

(54) MIRRORLESS SOLID STATE LiDAR

(71) Applicant: Liturex (Guangzhou) Co. Ltd, Guangzhou (CN)

(72) Inventor: Yunpeng Song, San Ramon, CA (US)

(73) Assignee: Liturex (Guangzhou) Co. Ltd., Guangzhou (CN)

( * ) Notice: Subject to any disclaimer, the term of this patent is extended or adjusted under 35 U.S.C. 154(b) by 1024 days.

(21) Appl. No.: 17/821,568

(22) Filed: Aug. 23, 2022

(65) Prior Publication Data

US 2024/0069167 A1 Feb. 29, 2024

(51) Int. Cl.

*G01S 7/481* (2006.01)
*G01S 7/484* (2006.01)
*G01S 7/497* (2006.01)
*H01S 5/40* (2006.01)

(52) U.S. Cl.

CPC .......... *G01S 7/4814* (2013.01); *G01S 7/4817* (2013.01); *G01S 7/484* (2013.01); *G01S 7/497* (2013.01); *H01S 5/4043* (2013.01)

(58) Field of Classification Search

CPC ... H01S 5/0071; G01S 7/4817; G01S 7/48–51
See application file for complete search history.

(56) References Cited

U.S. PATENT DOCUMENTS 9,980,395 B2 5/2018 Shimazawa et al.
2013/0342825 A1* 12/2013 Chimmalgi ........ G01N 21/8806 356/51
2016/0356889 A1* 12/2016 LaMantia ............. G01S 7/4815
2017/0235057 A1* 8/2017 Hemenway ........ G02B 27/0966 385/24
2019/0011567 A1* 1/2019 Pacala .................. G01S 7/4817
2019/0331775 A1* 10/2019 Song .................... G01S 7/4816
2020/0379088 A1 12/2020 Donovan et al.
2023/0119371 A1* 4/2023 Zhu ...................... G01S 7/4863 356/5.01
2023/0378889 A1* 11/2023 Laird .................... H02N 2/043

* cited by examiner

*Primary Examiner* — Yuqing Xiao
*Assistant Examiner* — Chia-Ling Chen
(74) *Attorney, Agent, or Firm* — Davis Wright Tremaine LLP

(57) ABSTRACT

A mirrorless light detection and ranging (LiDAR) device does not include any microelectromechanical system (MEMS) mirror. Instead, the LiDAR device uses a shifting device to shift a lens array or a laser beam emitting unit, or uses shifting devices to shift both a lens array and a laser beam emitting unit to cause relative motion between the laser beam emitting unit and the lens array. The laser beam emitting unit is a modularized component that includes multiple layers of submount-based edge emitting lasers (EELs) stacked in a staircase manner. Each time the lens array or the laser beam emitting unit changes position, the EELs are activated, one at a time, in a zigzagging sequence across the multiple layers to emit laser beams, with the laser beams emitted from an activation sequence filling up gaps between laser beams emitted from a previous activation sequence. A dynamic spatial filter including segmented areas with a one-to-one correspondence to the EELs in the laser beam emitting unit can be used to reduce noise.

16 Claims, 10 Drawing Sheets

MIRRORLESS SOLID STATE LiDAR

TECHNICAL FIELD

Embodiments of the present invention relate generally to remote sensing, and more particularly relate to a mirrorless solid state light detection and ranging (LiDAR) device.

BACKGROUND

A LiDAR device can measure distances to objects in an environment by illuminating the objects with laser beams and measuring reflected pulses from the objects. A LiDAR device includes a laser source to generate laser beams, which can be spot laser beams or linear laser beams.

Typically, a LiDAR device projecting linear laser beams tends to be more efficient than a LiDAR device projecting spot laser beams, as the scanner in the former does not have to scan along two axes as does the scanner in the latter. The LiDAR device can include a microelectromechanical system (MEMS) mirror that scans linear laser beams towards different directions. However, the mirror is typically very small (e.g., 2-3 mm effective diameter), so according to the etendue of light source, the collimated linear laser beams after the MEMS can have large remaining divergent angles (e.g., 0.5-0.8 degrees remaining divergent angles) along the orientation corresponding to the narrower beam size of the linear pattern in the far field. Larger remaining divergent angle for the illumination beam can result in lower angular resolution for LiDAR imaging.

SUMMARY

A mirrorless light detection and ranging (LiDAR) device does not include any microelectromechanical system (MEMS) mirror. Instead, the LiDAR device uses a shifting device to shift a lens array or a laser beam emitting unit, or uses shifting devices shift both the lens array and the laser beam emitting unit to cause relative motion between the laser beam emitting unit and the lens array. The laser beam emitting unit is a modularized component that includes multiple layers of submount-based edge emitting lasers (EELs) stacked in a staircase manner. Each time the lens array or the laser beam emitting unit is moved to a new position, and the EELs are activated, one at a time, in a zigzagging sequence across the multiple layers to emit laser beams, with the laser beams emitted from an activation sequence filling up gaps of field of views (FOVs) between neighboring laser beams emitted from a previous activation sequence. A dynamic spatial filter including segmented areas with a one-to-one correspondence to the EELs in the laser beam emitting unit can be used to reduce noise.

In an alternative embodiment, a mirrorless solid state LiDAR device does not include any microelectromechanical system (MEMS) mirror. Instead, the LiDAR device uses a shifting device included in an enclosure to shift positions of a lens array to control scanning directions of linear beams emitted by a set of submount-based edge emitting lasers. The set of lasers are turned on one at a time in a sequence as determined through a calibration process after the mirrorless LiDAR device is assembled. When a laser is turned on, a corresponding column of macro-pixels in a macro-pixel array in a light detector of the mirrorless LiDAR device is turned on to receive reflected photons from the laser. The shifting device can be a piezoelectric actuator. The enclosure also includes an elastic structure to push the lens array towards the direction of the shifting device.

BRIEF DESCRIPTION OF THE DRAWINGS

Embodiments of the disclosure are illustrated by way of example and not limitation in the figures of the accompanying drawings, in which like references indicate similar elements.

DETAILED DESCRIPTION

Figure 1:
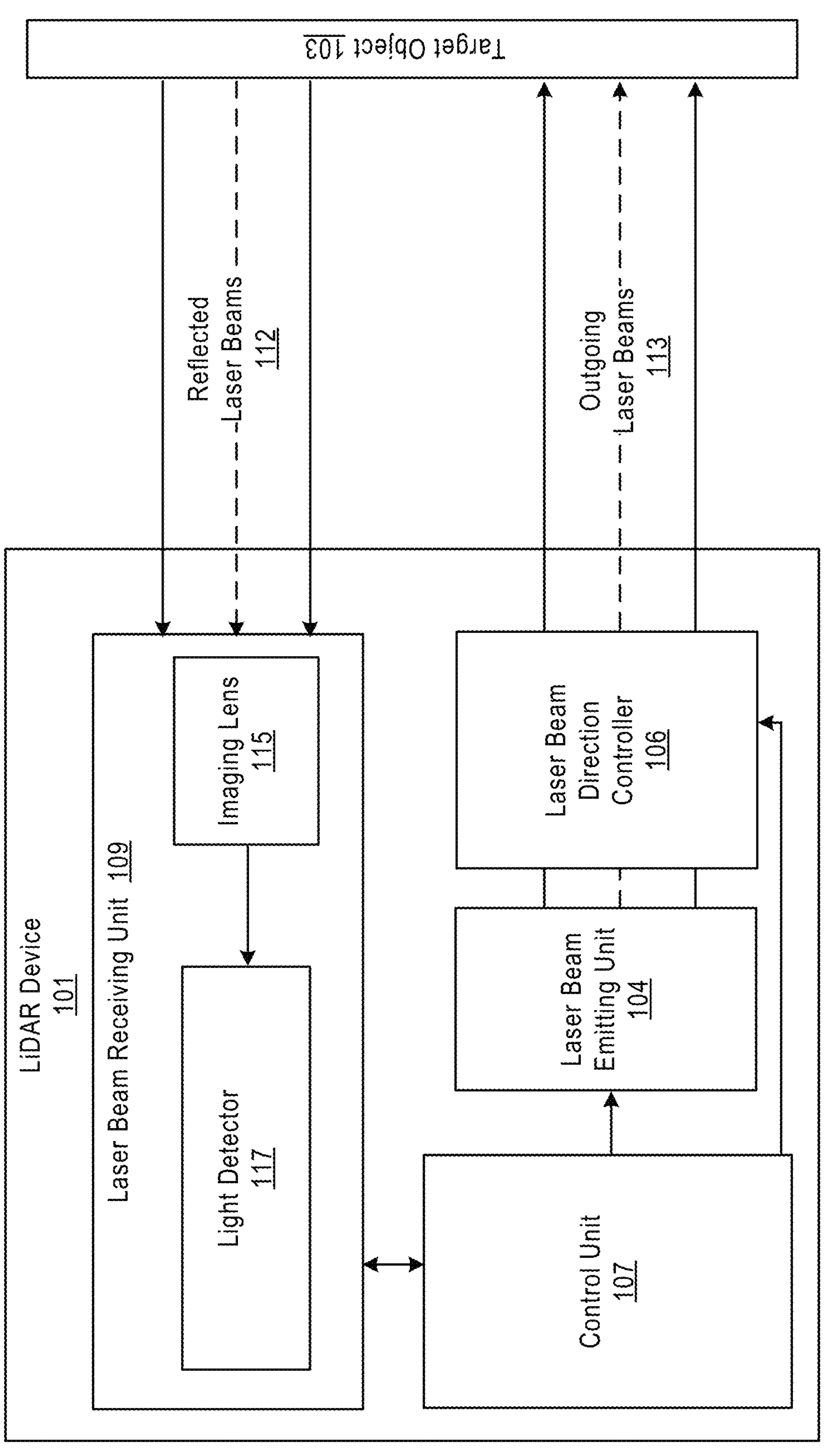
FIG. 1 shows a mirrorless LiDAR device in one embodiment.

The following description and drawings are illustrative and are not to be construed as limiting. Numerous specific details are described to provide a thorough understanding of various embodiments. However, in certain instances, well-known or conventional details are not described in order to provide a concise discussion of the embodiments.

In an embodiment, a mirrorless light detection and ranging (LiDAR) device does not include any microelectromechanical system (MEMS) mirror. Instead, the LiDAR device uses a shifting device to shift a lens array or a laser beam emitting unit, or uses shifting devices to shift both the lens array and the laser beam emitting unit to cause relative motion between the laser beam emitting unit and the lens array. The modularized laser beam emitting unit includes multiple layers of submount-based edge emitting lasers (EELs) stacked in a staircase manner. Each time the lens array or the laser beam emitting unit changes position, the EELs are activated, one at a time, in a zigzagging sequence across the multiple layers to emit laser beams, with the laser beams emitted from an activation sequence filling up gaps between laser beams emitted from a previous activation sequence. A dynamic spatial filter including segmented areas with a one-to-one correspondence to the EELs in the laser beam emitting unit can be used to reduce noise.

In an embodiment, the shifting device is an amplified piezoelectric actuator that can be coupled with either a lens array of the LiDAR device or the laser beam emitting unit.

In an embodiment, multiple such shifting devices can be used to shift both the laser beam emitting unit and the leans array to cause relative motion between the laser beam emitting and the leas array to cause outgoing laser beam to change directions.

In an embodiment, the submount-based EELs in the laser beam emitting unit are arranged in the plurality of layers in a staircase manner, with each lower layer displaced rightwards by a distance d, wherein d=L/m, wherein L is a width of a submount-based EEL plus a gap between neighboring EELs in a layer, and m is a number of the layers. Each layer includes a same number of submount-based EELs, which are substantially evenly spaced.

In an embodiment, activating the submount-based EELs according to the predetermined activation sequence comprises activating a first set of submount-based EELs, and then activating a second set of submount-based EELs. The first set of submount-based EELs includes a first submount-based EEL from each layer, and the second set of submount-based EELs includes a second submount-based EEL from each layer.

In an embodiment, each of the first set of submount-based EELs has a same or a different sequential position in their respective layers, and each of the second set of submount-based EELs has the same or different sequential position in their respective layers.

In an embodiment, the laser beam emitting unit is a modularized component, and one or more layers of submount-based EELs can be added to the laser beam emitting unit or removed therefrom.

In an embodiment, the LiDAR device can further include a dynamic spatial filter that includes a plurality of segmented areas. The segmented areas have a one-to-one correspondence with the plurality of submount-based EELs in the laser beam emitting unit, and each segmented area can be activated as an aperture to allow photons reflected from a laser beam emitted from a corresponding submount-based EEL to pass through the dynamic spatial filter.

According to another embodiment, a computer-implemented method of emitting laser beams from a light detection and ranging (LiDAR) device can perform the following operations: shifting, by a shifting device, a laser beam emitting unit orthogonally to an optical axis of a lens array positioned in an optical path of the laser beam emitting unit from a first position to a second position; and activating the plurality submount-based EELs in the same predetermined activation sequence, one at a time, to emit a plurality of linear laser beams at each of the first position and the second position. In this embodiment, the shifting device is coupled to a laser beam emitting unit that includes a plurality of submount-based edge emitting lasers (EEL) arranged in a plurality of layers, and each of the plurality of linear laser beams is emitted by one of the plurality of submount-based EELs, and is configured to be incident on a corresponding set of photodetectors in a light detector.

According to another embodiment, the LiDAR device does not include any microelectromechanical system (MEMS) mirror. Instead, the LiDAR device uses a shifting device included in an enclosure to shift positions of a lens array to control scanning directions of linear beams emitted by a set of submount-based edge emitting lasers. The set of lasers are turned on (i.e., activated) one at a time in a sequence as determined through a calibration process after the mirrorless LiDAR device is assembled. When a laser is turned on, a corresponding column of macro-pixels in a light detector of the mirrorless LiDAR device is turned on to receive reflected photons from the corresponding laser. The shifting device can be a piezoelectric actuator. The enclosure also includes an elastic structure to push the lens array towards the direction of the shifting device.

In one embodiment, the light detector comprises multiple columns of macro-pixels that form a macro-pixel array. When a particular laser of the edge emitting lasers of the mirrorless LiDAR device is turned on, a column of macro-pixels corresponding to the particular laser can be turned on, such that noise incident on the light detectors can be minimized to increase the signal to noise ratio of the mirrorless LiDAR device.

In one embodiment, the predetermined range covered by each laser is a range of angles that the laser is configured to cover. The range of angles can be determined by a field of view of the mirrorless LiDAR device and the number of lasers in the laser beam emitting unit. The more lasers the mirrorless LiDAR device has, the smaller the range of angles that each laser needs to cover.

In one embodiment, the shifting device can include a strain sensor and a metal wire that work together to form a feedback system to generate a closed-loop shifting. The metal wire attached to the shifting device is connected with the strain sensor. The displacement of the shifting device causes compression or stretching of the metal wire, respectively resulting in the decrease or increase of the electrical resistance of the metal wire. The resistance change can be monitored by the strain sensor that generates a feedback signal for the laser beam direction controller.

Each of the various embodiments described above can be practiced in a method. The above summary does not include an exhaustive list of all embodiments in this disclosure. All apparatuses and methods in this disclosure can be practiced from all suitable combinations of the various aspects and embodiments described in the disclosure.

FIG. 1 shows a mirrorless LiDAR device 101 in one embodiment. The mirrorless LiDAR device 101 can be a solid state LiDAR device, which can measure distances to objects in an environment by illuminating the objects with laser beams. Differences in return times of the reflected laser beams and wavelengths can be used to create a point cloud of the environment. The point cloud can provide spatial location and depth information, for use in identifying and tracking the objects.

As shown in FIG. 1, the mirrorless LiDAR device 101 can include a laser beam emitting unit 104, a laser beam direction controller 106, a laser beam receiving unit 109, and a control unit 107. The laser beam emitting unit 104 can include multiple laser emitters, each of which can emit linear laser beams.

Laser beams 113 emitted by the laser beam emitting unit 104 can be steered by the laser beam direction controller 106, which does not include any MEMS mirror. Instead, the laser beam direction controller 106 can be a metal enclosure, which includes an elastic structure on one end, a laser shifting device on the other end, and a lens array in the middle. Directions of outgoing laser beams 113 can be changed by the shifting device such that the LiDAR device 101 can have denser point clouds along the shifting orientation within the whole predetermined field of view.

The laser light receiving unit 109 can collect laser beams 112 reflected from a target object 103 using one or more imaging lenses (e.g., imaging lens 115), and focus the reflected laser beams on one or more light detectors (e.g., light detector 117). Each light detector can be a device that includes one or more photodetectors, each of which can be a high-sensitivity photodiode, for example, a linear mode avalanche-photodiode (APD) or a single-photon avalanche diode (SPAD). The one or more light detectors can generate electrons from photons captured by the imaging lens 115 from the reflected laser beams 112. The laser beam receiving unit 109 can send returned signals generated from the one or more light detectors to the control unit 107 for processing.

In one embodiment, the light detector 117 can include a predetermined number (e.g., 12) of macro-pixels that form a macro-pixel array. Each macro-pixel can include a predetermined number (e.g., 9) SPADs. For example, 12 macro-pixels in the light detector can be arranged in 3 rows of macro-pixels and 4 columns of macro-pixels. Macro-pixels in each row is connected by a bus, with an adder attached to the bus.

The control unit 107 can include control logic implemented in hardware, software, firmware, or a combination thereof, and can coordinate operations of the laser beam emitting unit 104, the laser beam direction controller 106, and the light detector 117.

For example, the control unit 107 can dynamically turn on and turn off each column of macro-pixels on the light detector 117, depending on which column is to receive reflected pulses. In one embodiment, when a particular column of macro-pixels is turned on, the other columns of macro-pixels on the light detector 117 are turned off.

By dynamically turning on and turning off the columns of macro-pixels, the signal to noise ratio of the LiDAR device 101 can be improved, since the turned-off macro pixels cannot receive any photons, including ambient photons.

Figure 2:
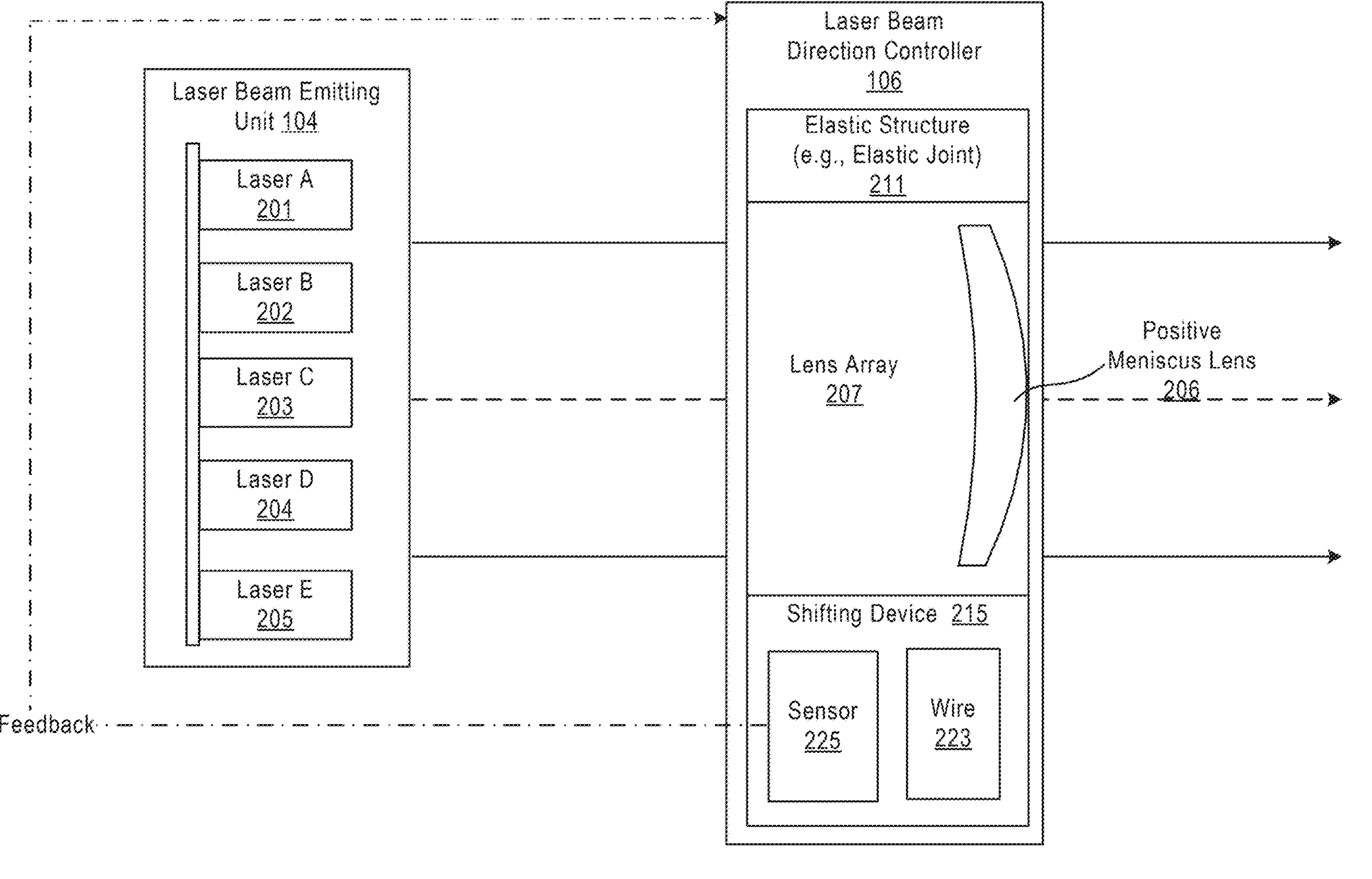
FIG. 2 further illustrates the mirrorless LiDAR device in one embodiment.

FIG. 2 further illustrates the mirrorless LiDAR device 101 in one embodiment. More specifically, FIG. 2 illustrates the laser beam emitting unit 104 and the laser beam direction controller 106.

In one embodiment, the laser beam emitting unit 104 can include multiple lasers 201-205. Each laser can be an integrated laser diode, comprising a number of laser diodes (also referred to as laser bars) packaged together. The lasers 201-205 are equally spaced. For example, the physical space between laser A 201 and laser B 202 is the same as the physical space between laser B 202 and laser C 203. Each laser can be an edge emitting laser integrated (e.g., soldered) on a submount. The number of lasers 201-205 are provided for illustration, and the actual number of lasers can vary based on a variety of factors in actual implementations.

In one embodiment, the laser beam direction controller 106 can be a metal enclosure comprising an elastic structure 211 on one end, a shifting device 215 on the other end, and a lens array 207 in between. The elastic structure 211 can be an elastic joint, and the shifting device 215 can be a piezoelectric actuator that is powered by electric current. The shifting device 215 can generate mechanical displacements based on voltages applied to the shifting device 215. The shifting device, together with the elastic structure 211, can shift the lens array 207 up and down (or leftwards and rightwards from the perspective of a user at the laser beam emitting unit 104).

When the shifting device 215 generates a mechanical displacement towards the lens array 207, the shifting device 215 can push the lens array 207 towards the elastic structure 211, causing the center of each lens (i.e., the optical/principal axis of the lens) in the lens array 207 to move in the same direction.

When the shifting device 215 generates a mechanical displacement away from the lens array 207, the elastic structure 211, which has been pressed previously by the shifting device 215, would attempt to return to its original state, thus generating a mechanical displacement towards the lens array 207 to push the lens array 207 towards the shifting device 215.

The lens array 207 can operate as a beam homogenizer for smoothing out irregularities in laser beams generated by each of the lasers 201-205 to create more uniform laser beams. In one embodiment, the lens array 207 can include at least one fast axis collimator (FAC), and a positive meniscus (convex-concave) lens 206 positioned at the right-most edge of the lens array 207. When the mechanical displacements of the shifting device are controlled by the control unit 107, the principal axis of the positive meniscus (convex-concave) 206 can be shifted up and down by the laser beam direction controller 106.

The control unit 107 can control the voltage applied to the shifting device 215 to produce the desired mechanical displacement. In one embodiment, a wire (e.g., a copper wire foil) 223 and a sensor 225 can be attached to the shifting device 215 (i.e., a piezoelectric actuator in one embodiment). The sensor 225 can function as a strain gauge to provide feedback to ensure that linear displacements are accurate. The wire 223 can be deformed when the shifting device 215 is shifted. This results in the wire resistance change, which is monitored by the strain sensor 225. The strain sensor 225 can have a corresponding feedback voltage signal so that the laser beam controller can have a proper control signal to apply to the piezoelectric actuator. Therefore, the piezoelectric actuator is moved based on a closed-loop shifting control system.

In one embodiment, by controlling the mechanical displacements of the shifting device 215 to move the principal axis of the positive meniscus lens 206 up and down, the chief array angle of linear laser beams from each of the lasers 201-205 and passing through the center of the positive meniscus lens will change, thus increasing the scanning angle of the LiDAR device 101.

Figure 3B:
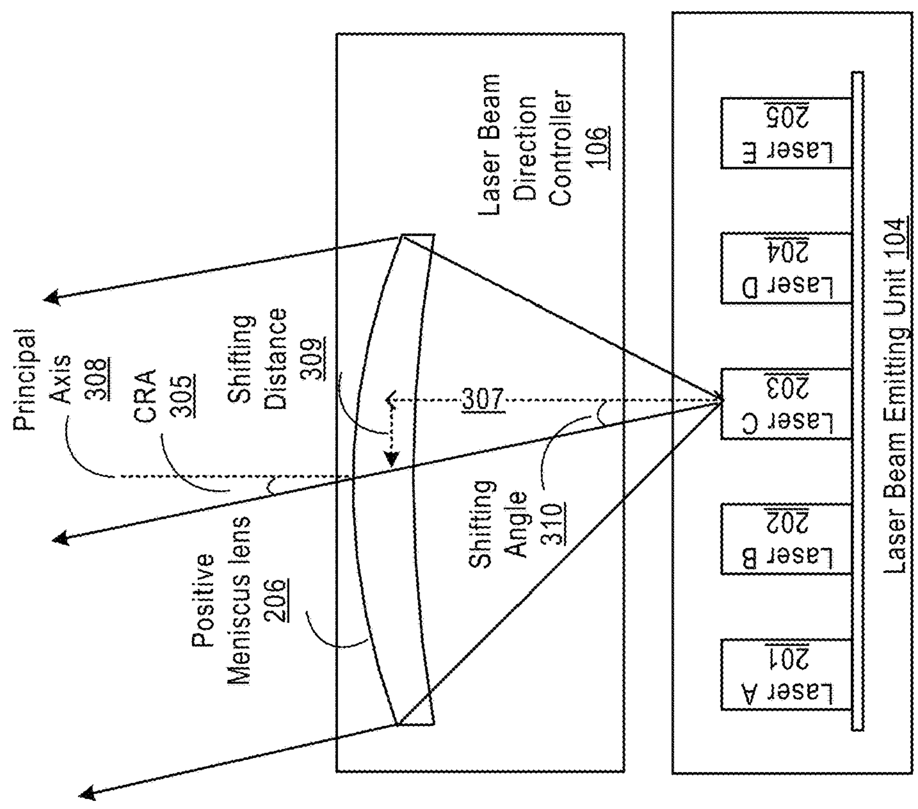
FIGS. 3A and 3B illustrate a scanning angle change of the LiDAR device in one embodiment.
Figure 3A:
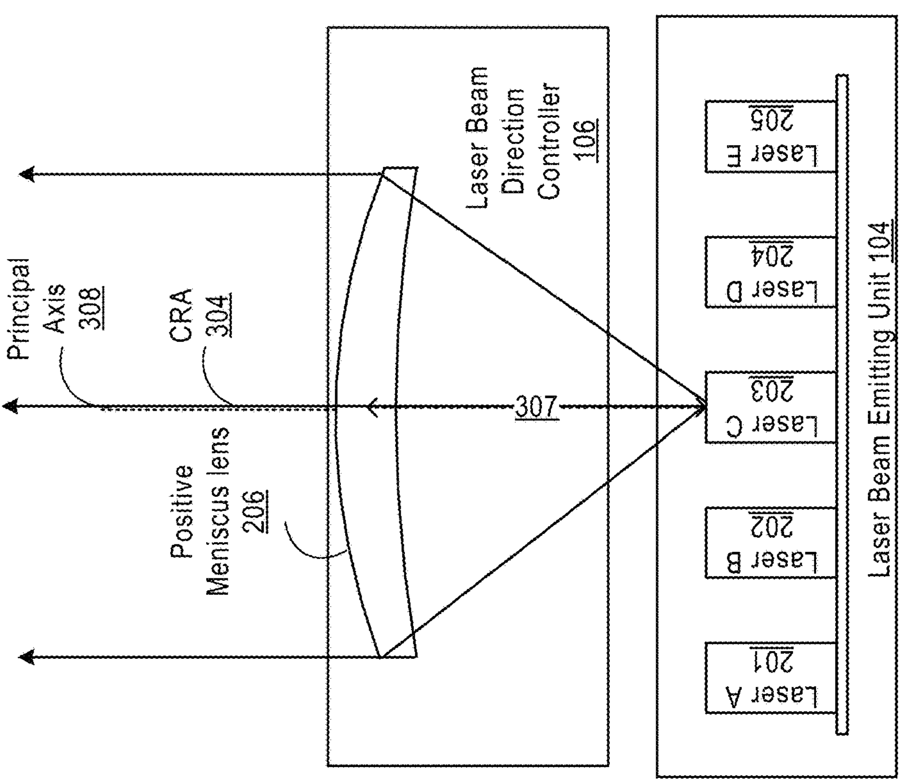

FIGS. 3A and 3B illustrate a scanning angle change of the LiDAR device in one embodiment. The figures use laser C 203 as an example. As shown in the figures, laser C 203 is in the middle of the lasers 201-205.

In FIG. 3A and FIG. 3B, for simplicity and easier illustration, only the positive meniscus lens 206 is shown. In FIG. 3A, the positive meniscus lens 206 is its default position, and laser C 203 is at the focal point of the positive meniscus lens 206. Thus, laser beams emitted by laser C 203 would pass through the center of the positive meniscus lens 206 and in parallel to its principal axis 308, and the chief ray angle (CRA) 304 of linear laser beams emitted by laser C 203 is zero.

In FIG. 3B, the positive meniscus lens 206 is shifted leftwards for a predetermined distance (e.g., 100 microns) 309. Such a shifting would create a shifting angle 310, whose size depends on the focus length 307 of the positive meniscus lens 206 and the predetermined shifting distance 309.

For example, if the focus length 307 is 12 mm, and the shifting distance is 100 microns (i.e., 0.1 mm), then the shifting angle 310 would be 0.1/12≈0.008333 radians, which is approximately equivalent to 0.48 degrees. In this embodiment, the shifting angle 310 and the chief ray angle 305 are the same.

The positive meniscus lens 206 can be shifted leftwards multiple times (e.g., 10 times), each shifting would increase the CRA 305 approximately by 0.48 degrees. Thus, after the multiple times of shifting, laser beams emitted from laser C 203 would cover 0.48*10=4.80 degrees. The 5 lasers would cover 4.80*5=24 degrees.

The above example is used for illustration purposes. In actual implementations, the shifting distance per shifting, the focal length, and the number of lasers can be different.

Further, a person skilled in the art would appreciate that when the positive meniscus lens 206 is shifted towards a direction for a particular distance, all the other lens in the laser beam direction controller 106 would be shifted together with the positive meniscus lens 206 in a similar manner.

Figure 4:
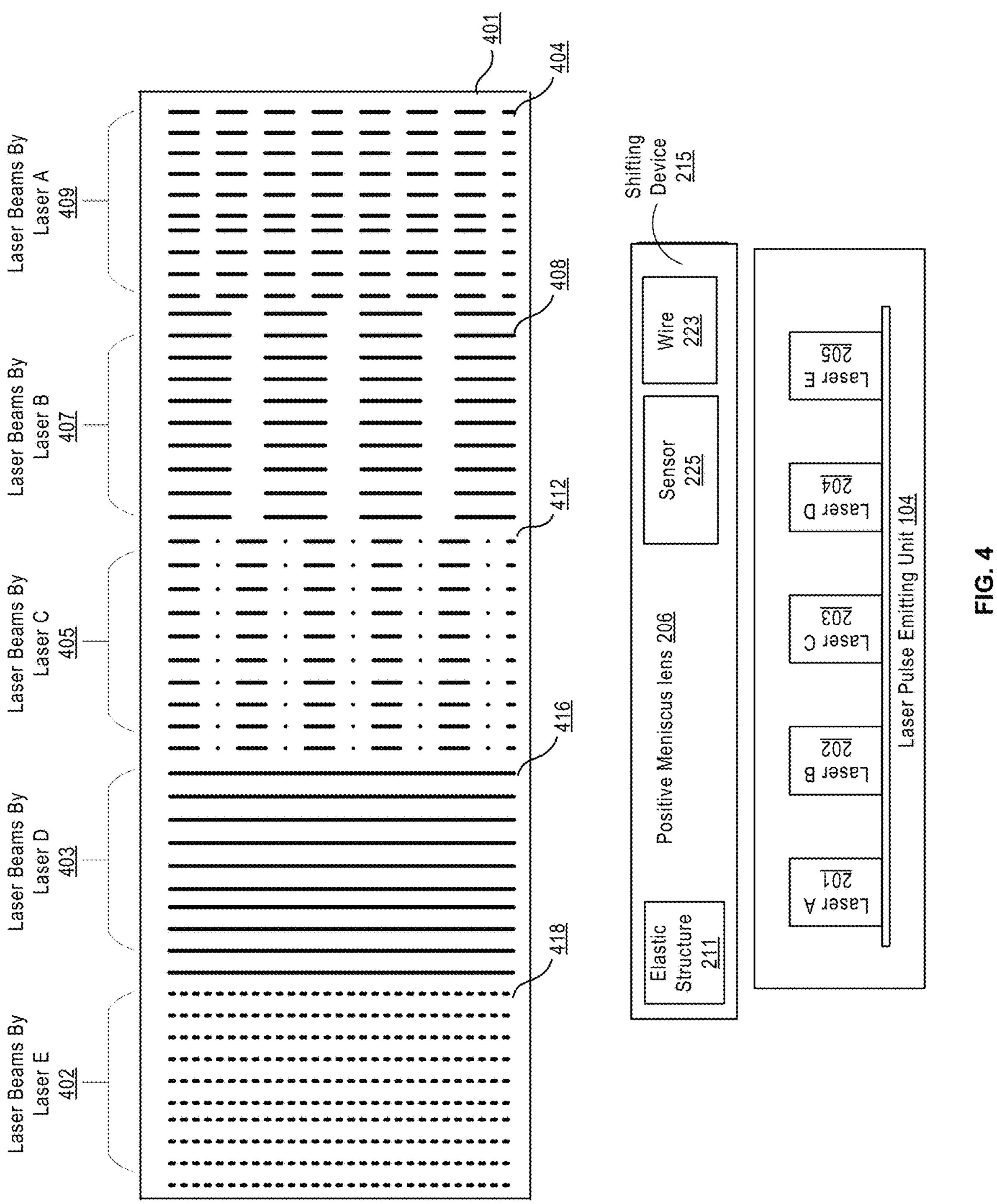
FIG. 4 illustrates an example of a target object with laser beams incident thereon from the LiDAR device in one embodiment.

FIG. 4 illustrates an example of a target object 401 with laser beams incident thereon from the laser beam emitting unit 104 in one embodiment.

As shown FIG. 4, the target object 401 receives laser beams from each of the 5 lasers 201-205. Laser beams A 409 are from laser A 201, laser beams B 407 are from laser B 202, laser beams C 405 are from laser C 203, laser beams D 403 are from laser D 204, and laser beams E 402 are from laser E 205.

As shown on the target object 401, each of the lasers 201-205 can emit laser linear beams that cover a particular angle due to the gradual leftwards shifting of the positive meniscus lens 206.

When the positive meniscus lens 206 is in the default position and the submount-based lasers 201-205 are perfectly manufactured, with each laser having a tolerance below a threshold, the lasers 201-205 can be turned on sequentially, one at a time, starting from laser A 201, followed by laser B 202, laser C 203, laser D 204, and laser E 205 in that order. However, if the submount-based lasers 201-205 are manufactured with a tolerance above the threshold for each laser, the sequence in which to turn on the lasers 201-205 can be determined by a calibration process to compensate for the tolerances.

In one embodiment, when any of the lasers 201-205 is turned on, the rest of the lasers 201-205 are turned off. Thus, at any particular time, only one laser is on. Correspondingly, on the light detector side, only one corresponding column of macro-pixels is turned on, and the rest of the macro-pixels are turned off.

After each of the lasers 201-205 has been turned on once, the lasers 201-205 can generate linear laser beams 404, 408, 412, 416, and 418 respectively. Then, the positive meniscus lens 206 can be shifted to different positions such that the linear laser beams from the lasers 201-205 can be scanned towards expected directions as shown on the target object 401.

Figure 5:
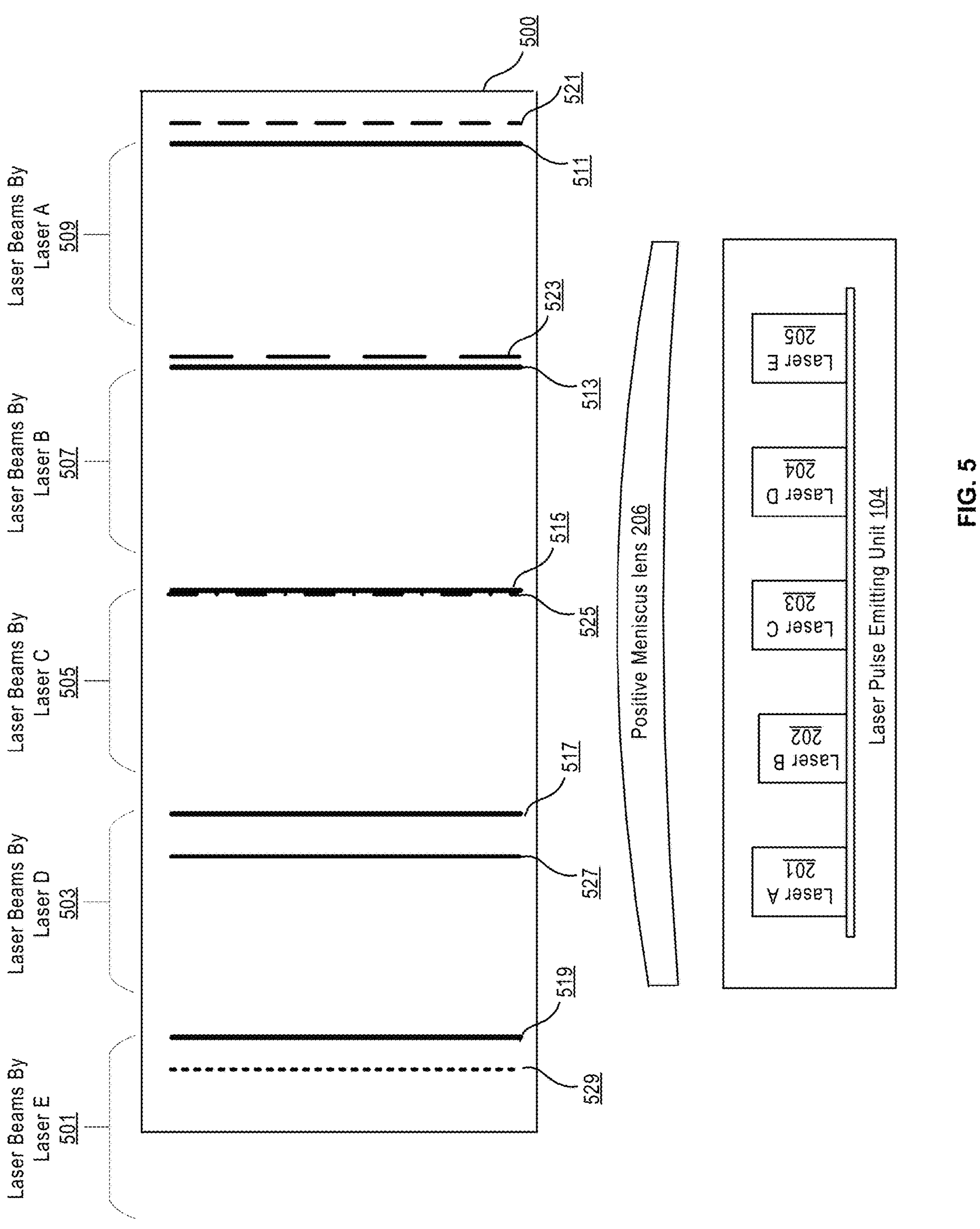
FIG. 5 illustrates discrepancies between expected positions and actual positions of linear laser beams from each laser in the mirrorless LiDAR device in one embodiment.

FIG. 5 illustrates discrepancies between initial expected positions and initial actual positions of linear laser beams from each laser in the mirrorless LiDAR device in one embodiment. The discrepancies are primarily due to tolerances of the submount-based lasers. The initial expected position for each laser is the expected position of linear laser beams from the laser on a calibration board 500 when the positive meniscus lens 206 is in its default position. Similarly, the initial actual position for each laser is the actual position of the linear laser beam on the calibration board 500 when the positive meniscus lens 206 is in its default position. In one embodiment, the default position of the positive meniscus lens 206 is the position that the positive meniscus lens 206 is when the shifting device 215 has not shifted the positive meniscus lens 206.

The discrepancies can serve as a starting point of a calibration process for determining the most efficient sequence in which to turn on the lasers 201-205 and the appropriate displacements that the shifting device needs to generate such that the tolerances of the lasers 201-205 can be properly compensated for. Such a calibration process needs to be performed after each mirrorless LiDAR device is assembled.

In FIG. 5, the calibration board 500 shows initial expected positions 511, 513, 515, 517, and 519 of linear laser beams from the lasers 201-205, and their respective actual positions 521, 523, 525, 527, and 529 when the positive meniscus lens 206 is in the default position. A discrepancy for each laser can then be calculated by a calibration application. In one embodiment, one way of calculating the discrepancy for each laser is to record each expected position and actual position, and then calculates a discrepancy between each pair of expected position and actual position.

Once the discrepancies are identified for the lasers 201-205, the calibration application can calibrate the LiDAR device 101 using different algorithms.

According to one calibration algorithm, the lasers 201-205 are ranked in a descending order based on their corresponding discrepancies. For example, the lasers 201-205 can be ranked as follows: laser C 203, laser B 202, laser A 201, laser E 205, and laser D 204.

In the next step of the calibration algorithm, the calibration application can turn on the lasers 201-205 based on the ranking, which means laser C 203 would be turned on first, and laser D 204 would be turned on last. When each laser is turned, the shifting device 215 can shift the positive meniscus lens 206 in a manner (e.g., direction and distance) such that the linear laser beams from each laser can fall on their respective expected positions.

For each of the other expected positions of linear laser beams from each laser, the shifting device 215 can similarly shift the positive meniscus lens 206 to enable the linear laser beams from each laser to fall on their expected positions.

After all the lasers have their linear laser beams fall on the expected positions, the calibration application can encode information related to the calibration in the LiDAR device to the control unit 107 of the LiDAR device 101. For example, the encoded information can include the sequence in which the lasers 201-205 are turned on, voltages applied to the shifting device 215 for each shifting, and a direction for each shifting.

Figure 6:
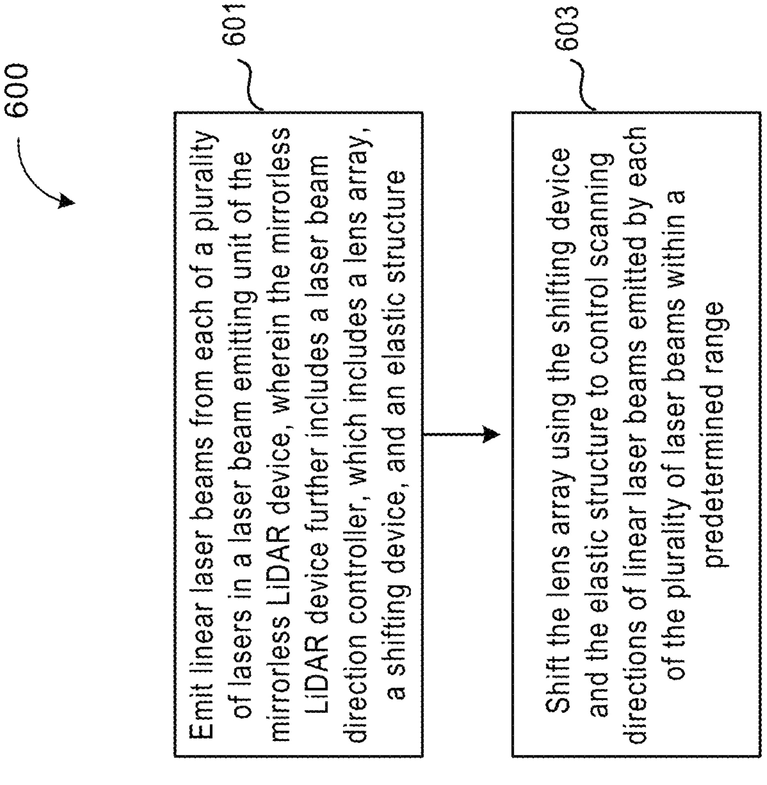
FIG. 6 illustrates a process of controlling scanning directions of linear laser beams from a mirrorless LiDAR device in one embodiment.

FIG. 6 illustrates a process 600 of controlling scanning directions of linear laser beams from a mirrorless LiDAR device in one embodiment. The process can be performed by a processing logic, containing software, hardware, or a combination thereof. For example, the processing logic can be the control logic 106 in FIG. 1.

As shown in FIG. 6, in operation 601, each laser in the mirrorless LiDAR device emits linear laser beams. The mirrorless LiDAR device includes multiple submount-based lasers, each laser being an edge emitting laser, and the lasers are turned on at a time in a particular sequence as determined by a calibration process after the LiDAR device is assembled. The mirrorless LiDAR device further includes a laser beam direction controller, which includes a lens array, a shifting device, and an elastic structure.

In operation 603, the shifting device and the elastic structure operate to shift the lens array using the shifting device and the elastic structure to control scanning directions of linear laser beams emitted by each of the plurality of lasers within a predetermined range. The predetermined range is a range of angles that the laser is configured to cover. The range of angles is determined by a field of view of the mirrorless LiDAR device and a number of lasers in the laser beam emitting unit.

Figures 7A, 7B:
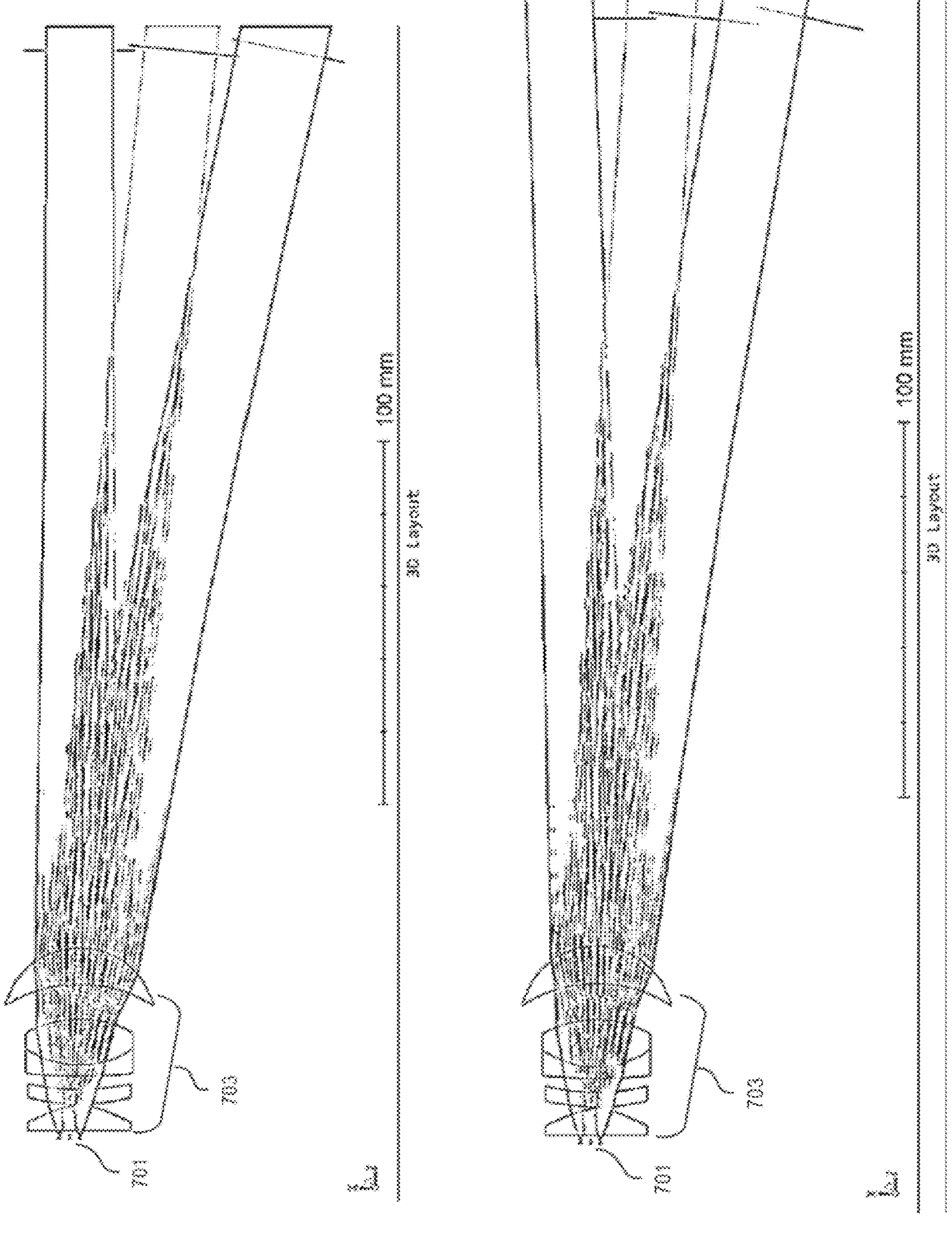
FIGS. 7A-7B illustrate a lens array (i.e., a set of lenses) that can be moved in the horizontal direction to control scanning direction of linear laser beams in one embodiment.

FIGS. 7A-7B illustrate a lens array (i.e., a set of lenses) that can be moved in the horizontal direction from the perspective of a user to control scanning direction of linear laser beams in one embodiment. FIG. 7A shows a plurality of lasers 701 and a lens array 703 in a default position, which means that the laser in the middle emits liner laser beams that pass the center of the lens array and in parallel to the principal axis of the lens array. FIG. 7B shows that the lens array is shifted leftwards from the perspective of a user at the plurality of lasers, thus causing linear laser beams from each laser to shift leftwards.

Figure 8:
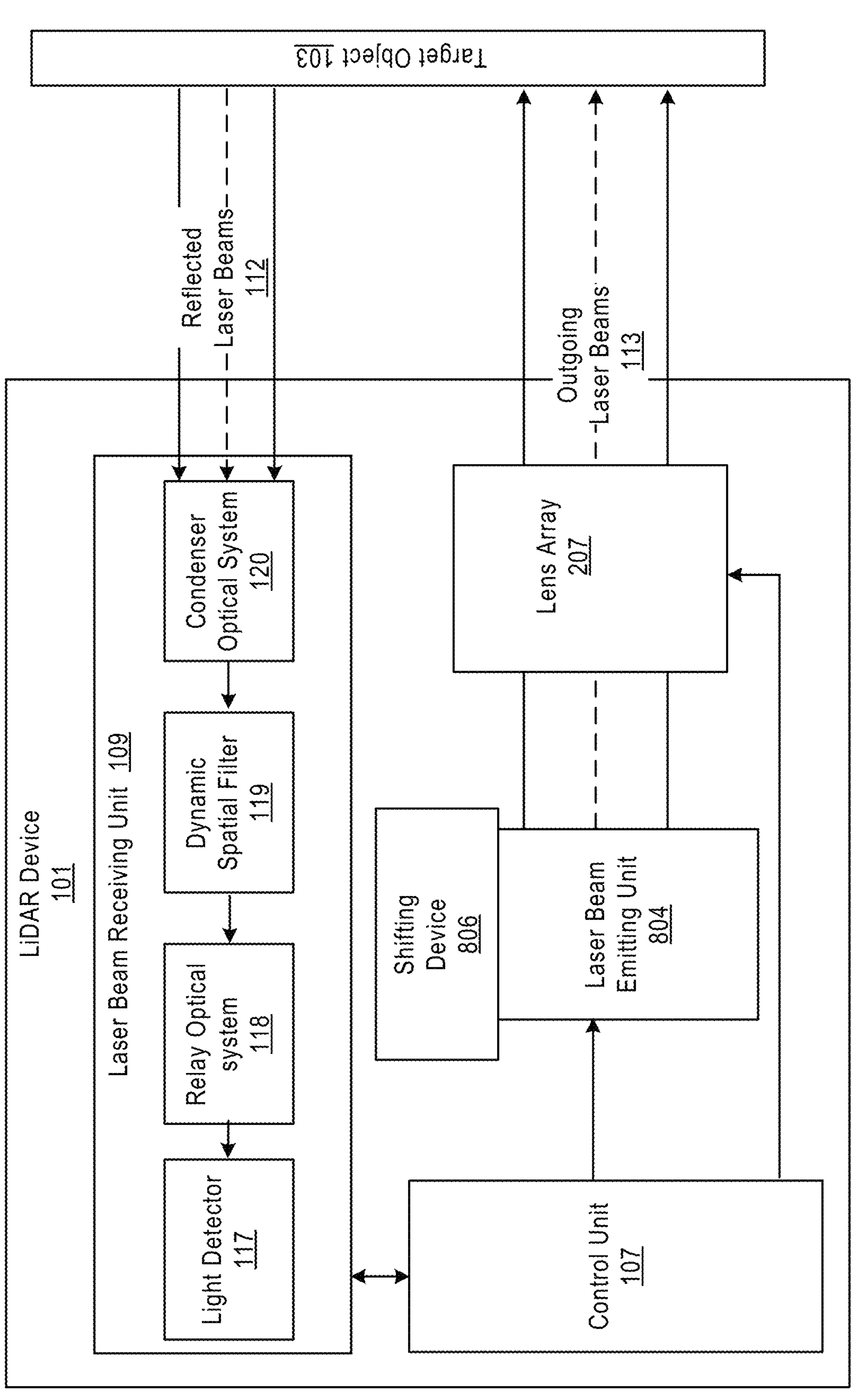
FIG. 8 illustrates a mirrorless LiDAR device according to another embodiment of the invention.

FIG. 8 illustrates a mirrorless LiDAR device according to another embodiment of the invention. In this embodiment, a shifting device 806 is coupled to a laser beam emitting unit 804 to cause the laser beam emitting unit 804 to move orthogonally to an optical axis of the lens array 207, thus causing the outgoing laser beams 113 to change steering directions.

The shifting device 806 can be the same as the shifting device 215 described in FIG. 2, or can be an amplified piezo actuator that will be described in detail in FIG. 9.

The laser beam emitting unit 804 can comprise multiple layers of sub-mounted edge emitting lasers (EELs) stacked in a staircase manner, with each layer including the same number of EELs. The EELs in the laser beam emitting unit 804 can be turned on sequentially, one at a time, in a zigzagging sequence across the multiple layers.

As further shown, the LiDAR device 101 can include a condenser optical system 120, a dynamic spatial filter 119, and a relay optical system 118 for use in focusing, transmitting, diverging, relaying, and intercepting reflected photons such that the reflected photons from a laser beam can be incident on a set of corresponding SPADs in the light detector 117.

In an embodiment, the relay optical system 118 can be used to reshape the reflected photons (i.e., reflected laser beams) after the reflected photons pass through the dynamic spatial filter 119. The relay optical system 118 can be a single cylindrical lens, a set of cylindrical micro lenses, a set of cylindrical mirrors, a set of cylindrical mirrors, an electromagnetic metasurface, or a diffuser. The condenser optical system 120 can be a lens, or a concave mirror, and can be used to focus the reflected laser beams onto a designated area on the dynamic spatial filter.

In one embodiment, the dynamic spatial filter 119 can be a 2-dimensional liquid crystal display (LCD) with multiple rows of segmented areas, which can be dynamically activated or deactivated (i.e., turned on or off) to allow photons to pass through the spatial filter or block the photons.

Figure 9:
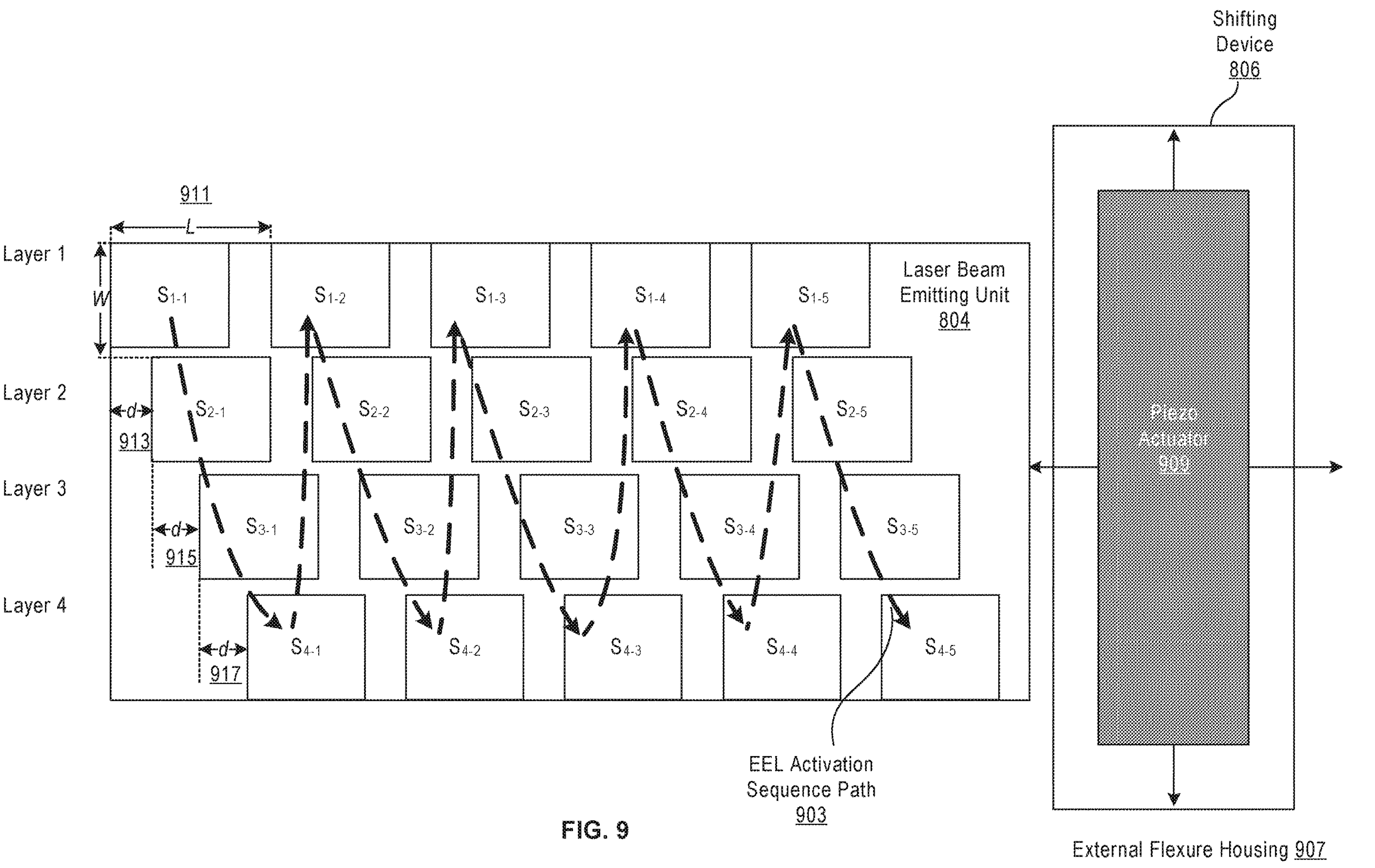
FIG. 9 illustrates the laser beam emitting unit according to one embodiment of the invention.

FIG. 9 illustrates the laser beam emitting unit 804 according to one embodiment of the invention.

As shown in FIG. 9, in this embodiment, the laser beam emitting unit 804 includes 20 EELs stacked in 4 layers, with each layer having 5 EELs. The EELs in each layer are substantially evenly spaced, and the distance between each pair of EELs in one layer is substantially the same as the distance between each pair of EELs in another layer. Further, the multiple layers are also evenly spaced, with the gap between the layers being substantially the same.

For example, the gap between EEL $S_{1-1}$ and EEL $S_{1-2}$, the gap between EEL $S_{1-4}$ and EEL $S_{1-5}$, and the gap between EEL $S_{2-4}$ and EEL $S_{2-5}$ are substantially the same.

The number of layers and the number of EELs in each layer in this embodiment are provided to illustrate the various features and the activation sequence of the EELs. In actual implementations, the number of layers and the number of EELs in each layer can be adjusted.

The four layers of EELs are stacked in a staircase manner, with each lower layer displaced rightwards for the same distance from its immediate higher layer. For example, all EELs in layer 2 are displaced rightwards for a distance d 913 compared to all EELs in layer 1; all EELs in layer 3 are displaced rightwards for the distance d 915 compared to all EELs in layer 2; and all EELs in layer 4 are displaced rightwards for the distance d 917 compared to all EELs in layer 3. A skilled artisan would appreciate that each layer can also be displaced leftwards for the distance d or another distance compared to its immediate higher layer.

In an embodiment, the distance d can be defined using the following formula: $d=L/m$, where L is the width of an EEL plus a gap between neighboring EELs in a layer, and m is the number of layers.

In an embodiment, the laser beam emitting unit 804 can be a modularized component, and one or more additional layers of EELs can be added to the laser beam emitting unit 804 or removed therefrom as needed. This feature increases the design flexibility, allowing LiDAR manufacturers to construct laser beam emitting units of different sizes based on their needs without relying on laser beam emitting unit manufacturers.

The EELs in the laser beam emitting unit 804 can be activated sequentially in a zigzagging manner as indicated by an EEL activation sequence path 903, according to which EEL $S_{1-1}$ is turned on first, followed by EEL $S_{2-1}$, EEL $S_{3-1}$, EEL $S_{4-1}$, EEL $S_{1-2}$, EEL $S_{2-2}$, EEL $S_{3-2}$, EEL $S_{4-2}$, EEL $S_{1-5}$, EEL $S_{2-5}$, EEL $S_{3-5}$, and EEL $S_{4-5}$, in that order.

After all the EELs are turned on in that sequence once, the shifting device 806 can cause the laser beam emitting unit 804 firmly coupled to the shifting device 806 to move to a new position, where all the EELs in the laser beam emitting unit 804 can be sequentially turned on again according to the EEL activation sequence path 903. After all the EELs in the laser beam emitting unit 804 are sequentially turned on the new position, the shifting device 806 can cause the laser beam emitting unit 804 to move to another position, where all the EELs are turned on sequentially according to the EEL activation sequence path 903, and so on, until the laser beam emitting unit 804 has changed positions a predetermined number of times.

As shown above, according to the EEL activation sequence path 903, each EEL located at the same position on their respective layers is activated before any EEL at a next position on any layer can be activated. In other words, the submount-based EELs are activated in multiple different sets, with each set including an EEL at the same position from each layer.

For example, the first set of EELs (e.g., EEL $S_{1-1}$, EEL $S_{2-1}$, EEL $S_{3-1}$, and EEL $S_{4-1}$) in the activation sequence path 903 can include an EEL positioned at the very beginning of each of the 4 layers, and the second of EELs (e.g., EEL $S_{1-2}$, EEL $S_{2-2}$, EEL $S_{3-2}$, and EEL $S_{4-2}$) in the activation sequence path 903 can include an EEL positioned immediately following the EEL positioned at the beginning of each layer.

In an alternative embodiment, the activation sequence path 903 can include multiple sets of EELs, with each set including an EEL from each of the 4 layers at different positions on their respective layers. This activation sequence represent modification to the activation sequence path 903, and the modification may be needed in some cases due to the calibration process described in FIG. 5.

In an embodiment, a customized collimation lens assembly (e.g., the lens array 207 in FIG. 2) can include a number of cylinder lenses to collimate laser beams from the EELs in the laser beam emitting unit 804 along the fast axis of the EEL, and to project the laser beams along the slow axis of the EEL to the far field in its nature. Thus, a laser beam from each EEL can be a laser line pattern in the far field, with the laser beam being narrow along the fast-axis beam and being a line shape along the slow-axis.

Due to the manner in which the EELs are stacked in the laser beam emitting unit 804, the emitted laser beams are not aligned at the top and the bottom between different layers. However, the effect of this misalignment is negligible as the relatively large beam divergence along the slow-axis (e.g., 12.5 degrees at the full beam width at half the intensity maximum) quickly expands the beam size in this orientation. The slow-axis beam in the far field can be orders of magnitude larger than m*W, where W is close to the submount width that is in a range of a few millimeters, and m is the number of layers (e.g., typically in a range from 5 to 10, which takes into account a trade-off between the maximum displacement of the piezo actuator and the maximum driving force of the actuator that is proportional to the weight of the whole source).

In an embodiment, the laser beam emitting unit 804 can be a piezo actuator 909 disposed in an external flexure housing 907, which includes a flexure frame operating as a lever arm used to amplify the displacement of the stand-alone piezo actuator 909. The shifting device 806 in this implementation can generate significantly larger displacements than the piezo actuator 909 alone without requiring a higher driver voltage and without sacrificing the response time. Further, the shifting device 806 does not suffer from backlash due to the flexure structure.

In an embodiment, the shifting device 806 can be used to replace the shifting device 215 in FIG. 1.

Figure 10:
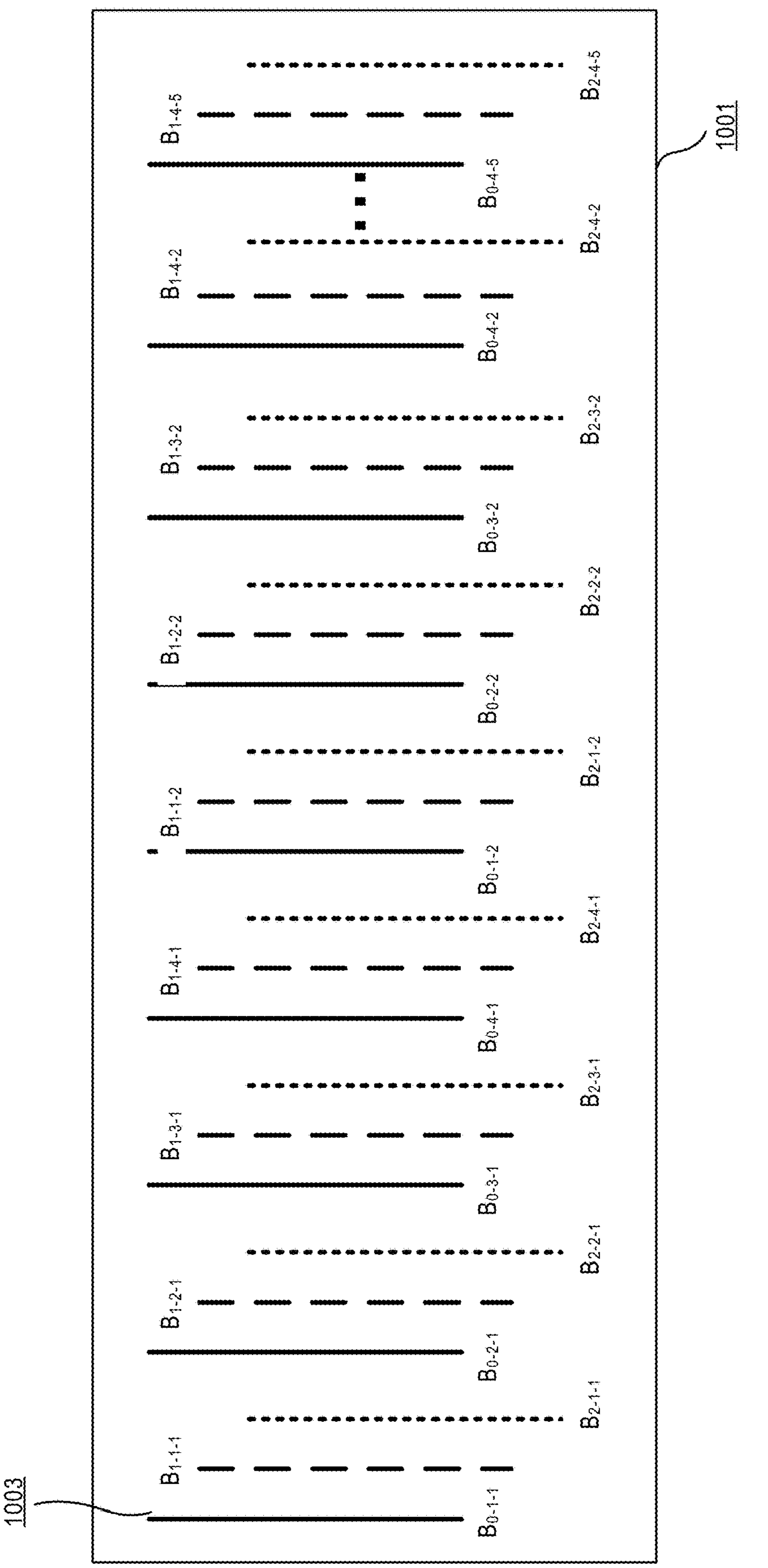
FIG. 10 illustrates linear beam patterns emitted by the laser beam emitting unit 804 according to an embodiment of the invention.

FIG. 10 illustrates linear beam patterns emitted by the laser beam emitting unit 804 according to an embodiment of the invention.

The beam pattern on a target object 1001 shows laser beams after the shifting device 806 causes the laser beam emitting unit 804 to shift to position 1 and position 2 from an initial position 0. The embodiments use the three positions for the purpose of illustration, and laser beams from additional positions are not shown.

Each vertical line on the target object 1001 represents a laser line from an EEL in the laser beam emitting unit 804, and has an associated reference number with three parts, with the first part indicating a position of the laser beam emitting unit 804, the second part indicating the layer of the corresponding EEL, and the third part indicating a position of the corresponding EEL in the layer.

For example, a vertical line 1003 has a reference number "0-1-1", suggesting that this laser beam line is emitted by the first EEL in layer 1 (i.e., EEL $S_{1-1}$ in FIG. 9) when the laser beam emitting unit 804 is in position 0, for example, a default or initial position.

As shown in FIG. 10, the EELs in the laser beam emitting unit 804 at position 0 can be sequentially turned on to emit laser beam lines $B_{0-1-1}$, $B_{0-2-1}$, $B_{0-3-1}$, $B_{0-4-1}$, $B_{0-1-2}$, $B_{0-2-2}$, $B_{0-3-2}$, $B_{0-4-2}$, . . . $B_{0-4-5}$. After all the EELs in the laser beam emitting unit 804 have been turned on once, one at a time, when the laser beam emitting unit 804 is at position 0, the laser beam emitting unit 804 is moved to position 1 by the shifting device 806. At position 1, the above activation sequence is repeated, emitting laser beam lines $B_{1-2-1}$, $B_{1-3-1}$, $B_{1-4-1}$, $B_{1-1-2}$, $B_{1-2-2}$, $B_{1-3-2}$, $B_{1-4-2}$, . . . $B_{1-4-5}$. Similarly, the above activation sequence is repeated after the laser beam emitting unit 804 is moved to position 2, emitting laser beam lines $B_{2-1-1}$, $B_{2-2-1}$, $B_{2-3-1}$, $B_{2-4-1}$, $B_{2-1-2}$, $B_{2-2-2}$, $B_{2-3-2}$, $B_{2-4-2}$, . . . $B_{2-4-5}$.

When an EEL emits a corresponding linear laser beam, only one set of SPADs (either one column or one row of individually addressable SPADs) in the light detector 117 can be activated to receive reflected photons from that linear laser beam.

Further, in an embodiment, a spatial filter can be placed between the laser beam emitting unit 804 and the light detector 117 to allow only photons reflected from that laser beam line to pass through the spatial filter to be incident on the corresponding set of SPADs in the light detector 117.

In one embodiment, the spatial filter can include an array of segmented areas that have a one-to-one correspondence with the EELs in the laser beam emitting unit 804. The segmented areas can be activated as an aperture sequentially, one at a time, to allow photons reflected from a laser beam emitted from a corresponding EEL to pass through the spatial filter.

The laser beam lines emitted by the laser beam emitting unit 804 in each subsequent activation sequence can fill gaps between linear laser beams emitted in a previous activation sequence, thereby increasing the resolution of the LiDAR device 101.

In an embodiment, the activation sequence path 903 may be modified based on results of a calibration. When that happens, the modified activation sequence would be repeated when the laser beam emitting unit 804 is shifted to a different position.

Some or all of the components as shown and described above may be implemented in software, hardware, or a combination thereof. For example, such components can be implemented as software installed and stored in a persistent storage device, which can be loaded and executed in a memory by a processor (not shown) to carry out the processes or operations described throughout this application. Alternatively, such components can be implemented as executable code programmed or embedded into dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

All of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the disclosure also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g., circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present disclosure are not described with reference to any particular programming language. It will be appreciated that a variety of programming languages may be used to implement the teachings of embodiments of the disclosure as described herein.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A computer-implemented method of emitting laser beams from a light detection and ranging (LiDAR) device, comprising:

shifting, by a shifting device, a laser beam emitting unit orthogonally to an optical axis of a lens array positioned in an optical path of the laser beam emitting unit from a first position to a second position, wherein the shifting device is coupled to the laser beam emitting unit, wherein the laser beam emitting unit includes a plurality of submount-based edge emitting lasers (EELs) arranged in a plurality of layers in a staircase manner, wherein each lower layer is displaced by a distance d, wherein d=L/m, wherein L is a width of a submount-based EEL plus a gap between neighboring EELs in a layer, and m is a number of the plurality of layers; and activating the plurality of submount-based EELs in a same predetermined activation sequence, one at a time, to emit a plurality of linear laser beams at each of the first position and the second position, wherein each of the plurality of linear laser beams is emitted by one of the plurality of submount-based EELs, and is configured to be incident on a corresponding set of photodetectors in a light detector.

2. The computer-implemented method of claim 1, wherein the shifting device is an amplified piezoelectric actuator.

3. The computer-implemented method of claim 1, wherein each of the plurality of layers of EELs includes a same number of submount-based EELs, which are substantially evenly spaced.

4. The computer-implemented method of claim 1, wherein activating the plurality of submount-based EELs according to the same predetermined activation sequence comprises activating a first set of submount-based EELs, and then activating a second set of submount-based EELs, wherein the first set of submount-based EELs includes a first submount-based EEL from each of the plurality of layers, and wherein the second set of submount-based EELs includes a second submount-based EEL from each of the plurality of layers.

5. The computer-implemented method of claim 4, wherein each of the first set of submount-based EELs has a same sequential position in their respective layers, and each of the second set of submount-based EELs has a same sequential position in their respective layers.

6. The computer-implemented method of claim 4, wherein the first set of submount-based EELs have different sequential positions in their respective layers, and the second set of submount-based EELs have different sequential positions in their respective layers.

7. The computer-implemented method of claim 1, wherein the laser beam emitting unit is a modularized component, wherein one or more layers of submount-based EELs are added to the laser beam emitting unit or removed therefrom.

8. The computer-implemented method of claim 1, wherein each of the plurality of linear laser beams is configured to pass through a dynamic spatial filter that includes a plurality of segmented areas, wherein the plurality of segmented areas have a one-to-one correspondence with the plurality of submount-based EELs in the laser beam emitting unit, and wherein each of the plurality of segmented areas can be activated as an aperture to allow photons reflected from a laser beam emitted from a corresponding submount-based EEL to pass through the dynamic spatial filter.

9. A light detection and ranging (LiDAR) device, comprising:

a laser beam emitting unit that includes a plurality of submount-based edge emitting lasers (EELs) arranged in a plurality of layers in a staircase manner, wherein each lower layer is displaced by a distance d wherein d=L/m, wherein L is a width of a submount-based EEL plus a gap between neighboring EELs in a layer, and m is a number of the plurality of layers;

a lens array positioned in an optical path of the laser beam emitting unit;

a shifting device coupled to the laser beam emitting unit, wherein the shifting device is configured to shift the laser beam emitting unit orthogonally to an optical axis of the lens array from a first position to a second position, wherein the plurality of submount-based EELs are activated in a same predetermined activation sequence, one at a time, to emit a plurality of linear laser beams at each of the first position and the second position; and wherein each of the plurality of linear laser beams is emitted by one of the plurality of submount-based EELs, and is configured to be incident on a corresponding set of photodetectors in a light detector.

10. The LiDAR device of claim 9, wherein the shifting device is an amplified piezoelectric actuator.

11. The LiDAR device of claim 9, wherein each of the plurality of layers of EELs includes a same number of submount-based EELs, which are substantially evenly spaced.

12. The LiDAR device of claim 9, wherein activating the plurality of submount-based EELs according to the same predetermined activation sequence comprises activating a first set of submount-based EELs, and then activating a second set of submount-based EELs, wherein the first set of submount-based EELs includes a first submount-based EEL from each of the plurality of layers, and wherein the second set of submount-based EELs includes a second submount-based EEL from each of the plurality of layers.

13. The LiDAR device of claim 12, wherein each of the first set of submount-based EELs has a same sequential position in their respective layers, and each of the second set of submount-based EELs has a same sequential position in their respective layers.

14. The LiDAR device of claim 12, wherein the first set of submount-based EELs have different sequential positions in their respective layers, and the second set of submount-based EELs have different sequential positions in their respective layers.

15. The LiDAR device of claim 9, wherein the laser beam emitting unit is a modularized component, wherein one or more layers of submount-based EELs are added to the laser beam emitting unit or removed therefrom.

16. The LiDAR device of claim 9, further comprising:

a dynamic spatial filter that includes a plurality of segmented areas, wherein the plurality of segmented areas have a one-to-one correspondence with the plurality of submount-based EELs in the laser beam emitting unit, and wherein each of the plurality of segmented areas can be activated as an aperture to allow photons reflected from a laser beam emitted from a corresponding submount-based EEL to pass through the dynamic spatial filter.

* * * * *